(12) United States Patent
Li et al.

(10) Patent No.: US 11,486,945 B1
(45) Date of Patent: Nov. 1, 2022

(54) DEVICE AND METHOD FOR MEASURING SCALAR MAGNETIC FIELD BASED ON PULSED OPTICAL PUMPING

(71) Applicant: Zhejiang University of Science and Technology, Hangzhou (CN)

(72) Inventors: Shuguang Li, Hangzhou (CN); Jinsheng Liu, Hangzhou (CN); Ming Jin, Hangzhou (CN); Kenneth Tetteh Akiti, Hangzhou (CN); Eric-Theophilus Tochukwu Nwodom, Shanghai (CN)

(73) Assignee: Zhejiang University of Science and Technology, Hangzhou (CN)

( * ) Notice: Subject to any disclaimer, the term of this patent is extended or adjusted under 35 U.S.C. 154(b) by 0 days.

(21) Appl. No.: 17/857,380

(22) Filed: Jul. 5, 2022

(51) Int. Cl.
*G01R 33/26* (2006.01)
(52) U.S. Cl.
CPC .................................... *G01R 33/26* (2013.01)
(58) Field of Classification Search
CPC .... G01N 24/006; G01R 33/032; G01R 33/26; G01R 33/282
See application file for complete search history.

(56) References Cited

U.S. PATENT DOCUMENTS 4,899,345 A * 2/1990 Cyr ........................... G01J 3/12
  372/32
8,587,304 B2 * 11/2013 Budker .................. G01R 33/26
  324/304

(Continued)

FOREIGN PATENT DOCUMENTS

CN   103869265 A   6/2014
CN   106291409 A   1/2017
(Continued)

OTHER PUBLICATIONS

Mingjian Ma, Hailiang Chen, Shuguang Li, Xili Jing, Wenxun Zhang, and Mingyue Wang; Analysis of a Magnetic Field Sensor Based on a Sagnac Interferometer Using a Magnetic Fluid-Filled Birefringent Photonic Crystal-Fiber; IEEE Photonics Journal, vol. 11, No. 4, Aug. 2019; State Key Laboratory of Metastable Materials Science and Technology and Key Laboratory for Microstructural Material Physics of Hebei Province, School of Science, Yanshan University, Qinhuangdao 066004, China.

(Continued)

*Primary Examiner* — Jay Patidar
(74) *Attorney, Agent, or Firm* — Wayne IP LLC

(57) ABSTRACT

A device for measuring a scalar magnetic field based on pulsed optical pumping, including: a first laser, a first isolator, a first λ/2 waveplate, a first polarizing beam splitter, a first coupler, a first spectrum analyzer, a reflector, an atomic sensor probe, a second λ/2 waveplate, a second polarizing beam splitter, a first photoelectric converter, a second photoelectric converter, a data acquisition system, a second laser, a second isolator, an acousto-optic modulator, a third λ/2 waveplate, a third polarizing beam splitter, a second fiber coupler, a second spectrum analyzer, a λ/4 waveplate and a beam expander. Two planar reflectors are respectively arranged at two sides of the atomic sensor probe and face towards the atomic sensor probe, and are arranged parallel to the pump beam input to the atomic sensor probe.

9 Claims, 4 Drawing Sheets

(56) References Cited

U.S. PATENT DOCUMENTS

| | | | | |
|---|---|---|---|---|
| 9,915,711 B2* | 3/2018 | Kornack | ............... | G01R 33/26 |
| 2020/0041255 A1* | 2/2020 | Ahmed | ............. | G02B 27/1006 |
| 2021/0278371 A1* | 9/2021 | Chalupczak | ......... | G01N 24/006 |

FOREIGN PATENT DOCUMENTS

| | | |
|---|---|---|
| CN | 109188316 A | 1/2019 |
| CN | 110579724 A | 12/2019 |
| CN | 111337864 A | 6/2020 |
| CN | 111983526 A | 11/2020 |
| CN | 112946542 A | 6/2021 |

OTHER PUBLICATIONS

Xue Zhou, Xuegang Li, Shuguang Li, Guo-Wen An, and Tonglei Cheng; Magnetic Field Sensing Based on SPR Optical Fiber Sensor Interacting With Magnetic Fluid; IEEE Transactions on Instrumentation and Measurement, vol. 68, Issue 1, Jan. 2019; College of Information Science and Engineering, Northeastern University, Shenyang, China.

* cited by examiner

DEVICE AND METHOD FOR MEASURING SCALAR MAGNETIC FIELD BASED ON PULSED OPTICAL PUMPING

CROSS-REFERENCE TO RELATED APPLICATIONS

This application claims the benefit of priority from Chinese Patent Application No. 202110756202.9, filed on Jul. 5, 2021. The content of the aforementioned applications, including any intervening amendments thereto, is incorporated herein by reference in its entirety.

TECHNICAL FIELD

The present disclosure relates to detection of weak magnetic fields, and more particularly to a device and method for measuring a scalar magnetic field based on pulsed optical pumping.

BACKGROUND

High-sensitivity weak magnetic detection has been widely used in biomedicine, space exploration, geophysics and ocean exploration. For example, some organs of the human body or other organisms, such as heart and brain, can produce extremely weak magnetic fields in which a plenty of information is contained, and provides an important reference for medical researches. All-optical atomic magnetometer and associated detection techniques thereof attract a lot of attention due to their desirable sensitivity. At present, the high-sensitivity weak magnetic field detection based on all-optics mainly includes spin-exchange-relaxation-free (SERF), optical pumping (OP) and non-linear magneto-optical rotation (NMOR) and the combination and improvement thereof. The basic principle of these techniques is to measure an oscillation signal or spin evolution signal of a polarized atom in a magnetic field using a narrow line-width laser, by analyzing characteristics of the signals, magnitude and variation of magnetic field are obtained.

The SERF is a vector weak magnetic detection method. Under a near-zero magnetic field (extremely weak background magnetic field), the spin of highly polarized and high-density atoms remain coherent for a long time and their decaying relaxation is magnetic field dependent. The SERF magnetometer is more suitable for precision measurements in near-zero magnetic fields, with high sensitivity, but requires magnetic shield. For larger background magnetic fields, such as the earth's magnetic field, the SERF will not work properly unless active compensation is used. In order to achieve high atomic density, high temperature above 150° C. is required. In addition, in order to improve sensitivity and suppress noise during measuring, a lock-in amplifier (LIA) is often required. An excessive sampling frequency will also directly attenuate the sensitivity, and thus the actual sampling frequency or bandwidth is often set to 10-100 Hz, seldom reaching the kHz level.

Optical pumping magnetometer (OPM) simultaneously enables the single-axial measurement of a scalar magnetic field and the multi-axial measurement of a vector magnetic field. Based on the Zeeman splitting of atomic energy levels under the action of a magnetic field, a radio-frequency (RF) field is used to match an energy difference between splitting two energy levels, causing atomic resonance and absorption, and a magnitude of the magnetic field is obtained from an absorption signal and a frequency of the RF field. The OPM can allow the high-sensitivity detection, and can be operated in a strong magnetic field such as geomagnetic field; however, the LIA is also necessary to improve sensitivity and reduce noise. In view of this, the sampling frequency is also not high, commonly 10-100 Hz.

Pulsed optical pumping-based NMOR is mainly a scalar detection method. Atoms polarized by pump beam in the magnetic field will produce precession (Larmor precession), by measuring the frequency of the precession, a magnitude of the magnetic field is obtained. On one hand, the beneficial effects of the NMOR are as follows. (1) The NMOR has an ability to operate in large background magnetic field such as the geomagnetic field. (2) compared to the SERF, where the same atomic medium is used, the NMOR can achieve better performance below 100° C., without a high temperature as the SERF. (3) The NMOR uses a direct frequency measurement with natural reference, thus a long-term operation is calibration-free. (4) The NMOR is not need the LIA, having a simpler structure. (5) The NMOR has high sensitivity, and can be optimized to reach a level of the SERF. One the other hand, the shortcomings of the NMOR are as follows. (1) The NMOR uses a pulsed pump-probe mode, in which a pump beam is a periodic pulse $t_1$, the longer the pulse time, the higher the pumping efficiency, and then there is a certain duration of RF pulse $t_2$. Thus, the sampling will consume a certain amount of time, which will affect the sampling frequency $f_B$ of the magnetic field measurement. (2) A repetition period $T_0$ for each sampling point is related to a signal-to-noise ratio of an output signal and a decaying relaxation time $T_2$ of atomic spins after polarization. If the repetition period is shortened to increase the sampling frequency $f_B$, the signal-to-noise ratio and the sensitivity may be reduced. (3) A high sampling frequency $f_B$ will lead to an increase in the data size and significantly increase the processing difficulty. In general, it is a challenge to increase the sampling frequency while keeping high sensitivity.

Nevertheless, some important applications such as space exploration and biomagnetic field detection require a higher magnetic field sampling frequency $f_B$ to obtain more information. Therefore, a method and device for measure magnetic field that can effectively increase the sampling frequency and have high sensitivity are needed.

SUMMARY

In order to overcome the above-described problems, the present disclosure provides a device and method for measuring a scalar magnetic field based on pulsed optical pumping, which have high sampling frequency as well as excellent detection sensitivity.

The technical solutions of the present disclosure are described as follows.

In a first aspect, the disclosure provides a device for measuring a scalar magnetic field based on pulsed optical pumping, comprising:

a first laser configured to emit a probe beam; and a second laser configured to emit a pump beam;

wherein an output end of the first laser is connected to an input end of a first isolator; an output end of the first isolator is connected to an input end of a first λ/2 waveplate; an output end of the first λ/2 waveplate is connected to an input end of a first polarizing beam splitter configured to split a beam into two beams; a first output end of the first polarizing beam splitter is connected to an input end of a first fiber coupler; an output end of the first fiber coupler is connected to an input end of a first spectrum analyzer configured to perform dynamic detection; a beam output from a second output end of the first polarizing beam splitter is configured to be transformed by a reflector and then enter an atomic sensor probe; an emergent light from the atomic sensor probe is configured to be input to a second λ/2 waveplate; an output end of the second λ/2 waveplate is connected to an input end of a second polarizing beam splitter configured to split a beam into two beams; a first output end of the second polarizing beam splitter is connected to an input end of a first photoelectric converter; a second output end of the second polarizing beam splitter is connected to an input end of a second photoelectric converter; and a differential output end of the first photoelectric converter and a differential output end of the second photoelectric converter are both connected to a data acquisition system configured to acquire, store, process and display a detection signal;

an output end of the second laser is connected to an input end of a second isolator; an output end of the second isolator is connected to an input end of an acousto-optic modulator configured to control beam intensity; an output end of the acousto-optic modulator is connected to an input end of a third λ/2 waveplate; an output end of the third λ/2 waveplate is connected to an input end of a third polarizing beam splitter configured to split a beam into two beams; a first output end of the third polarizing beam splitter is connected to an input end of a second fiber coupler; an output end of the second fiber coupler is connected to an input end of a second spectrum analyzer configured to perform dynamic detection; a second output end of the third polarizing beam splitter is connected to a λ/4 waveplate configured to transform a beam into a circularly polarized beam; and an output beam of the λ/4 waveplate is configured to be expanded by a beam expander and then enter the atomic sensor probe; and a first planar reflector is arranged at one side of the atomic sensor probe, and a second planar reflector is arranged at the other side of the atomic sensor probe; the first planar reflector and the second planar reflector both face toward the atomic sensor probe; and the first plane reflector and the second planar reflector are arranged parallel to a pump beam input to the atomic sensor probe.

In some embodiments, the atomic sensor probe comprises a vapor cell; a thermal insulation chamber is provided outside the vapor cell; a heater configured to heat the vapor cell is provided inside the thermal insulation chamber; the heater is connected to a temperature controller configured for temperature stabilization; a three-dimensional (3D) magnetic field coil is provided outside the vapor cell; and a precision current source of the 3D magnetic field coil is electrically connected to a controller configured to control magnetic field intensity.

In some embodiments, the vapor cell is transparent and filled with saturated rubidium vapor.

In some embodiments, the first laser is electrically connected to a controller; and the controller is configured to control a temperature and current of the first laser.

In some embodiments, the second laser is electrically connected to a controller; and the controller is configured to control a temperature and current of the second laser.

In some embodiments, the acousto-optic modulator is electrically connected to a controller configured to control the acousto-optic modulator.

In a second aspect, the disclosure provides a method for measuring a scalar magnetic field using the device of claim 1, comprising:

(a) adjusting positions of the first planar reflector and the second planar reflector; placing the atomic sensor probe into a magnetic shield; heating the atomic sensor probe to a preset temperature to generate a static magnetic field along a z-direction of a 3D magnetic field coil; and superimposing an alternating magnetic field on the static magnetic field;

(b) from an initial moment $t=0$, periodically turning off and on, by the acousto-optic modulator in combination with a controller, the second laser to periodically emit the pump beam, wherein a turn-on duration of the second laser is $t_1$, and a duration of each on-off cycle is $T_0$;

(c) from the initial moment $t=0$, loading a radio frequency (RF) pulse in a y-direction of the 3D magnetic field coil, wherein a duration of the RF pulse is $t_2$; the RF pulse is in a sinusoidal waveform; a frequency of the RF pulse is the same as an atomic spin precession frequency; and an amplitude and the duration of the RF pulse are optimizable according to an optical measurement signal;

(d) from the initial moment $t=0$, continuously turning on the first laser to emit the probe beam to pass through the atomic sensor probe to generate a signal; and receiving, by the first photoelectric converter and the second photoelectric converter, the signal;

(e) from the initial moment $t=0$, acquiring and analyzing, by the data acquisition system, the signal received by the first photoelectric converter and the second photoelectric converter, wherein an effective data acquiring duration of the signal is $T_0-t_2$;

(f) under a continuous mode or a gap mode, from the initial moment $t=0$, acquiring an ambient magnetic field data; and (g) subjecting the ambient magnetic field data to spectral analysis and fitting to obtain a measurement sensitivity and a magnetic field change frequency.

In some embodiments, under the continuous mode, the ambient magnetic field data is periodically and continuously collected; a sampling frequency $f_s$ of an original data point is determined by the data acquisition system; in each pulse period which is the same as each on-off cycle $T_0$, the signal is analyzed to obtain an ambient magnetic field data point $B_n$ containing a time stamp, such that a sampling frequency of ambient magnetic field data points $B_1, B_2, B_3 \ldots B_n$ is $1/T_0$.

In some embodiments, under the gap mode, the ambient magnetic field data is collected through steps of: performing periodic and continuous sampling N times followed by an interval without sampling; then performing periodic and continuous sampling N times again followed by an interval without sampling; and repeating such processes; a sampling frequency $f_s$ of an original data point is determined by the data acquisition system; in each pulse period $T_0$, the signal is analyzed to obtain an ambient magnetic field data point $B_n$ containing a time stamp; every N ambient magnetic field data points are grouped into one group, and a sampling frequency of each group is $1/T_0$; an interval is provided between adjacent two groups; and data measurement is not performed during the interval.

The present disclosure has the following beneficial effects.

(1) The pump beam and the probe beam provided herein are capable of multiple optical path foldback by a combination of parallel plane reflectors and atomic sensor probe technology, effectively increasing an action distance and angle of Faraday rotation light, having a stable structure, improving a sensitivity of magnetic field measurement and easier to build and adjust.

(2) The continuous mode or gap mode is performed. Other interrupt operations can be performed during the measurement process, and a sampling can still be efficiently performed when a data volume is large, increasing the sampling frequency $f_B$ of the magnetic field measurement.

(3) The measurement method provided herein enables the high-sensitivity measurement of a weak magnetic field, and has an improved sampling frequency.

DETAILED DESCRIPTION OF EMBODIMENTS

Figure 1:
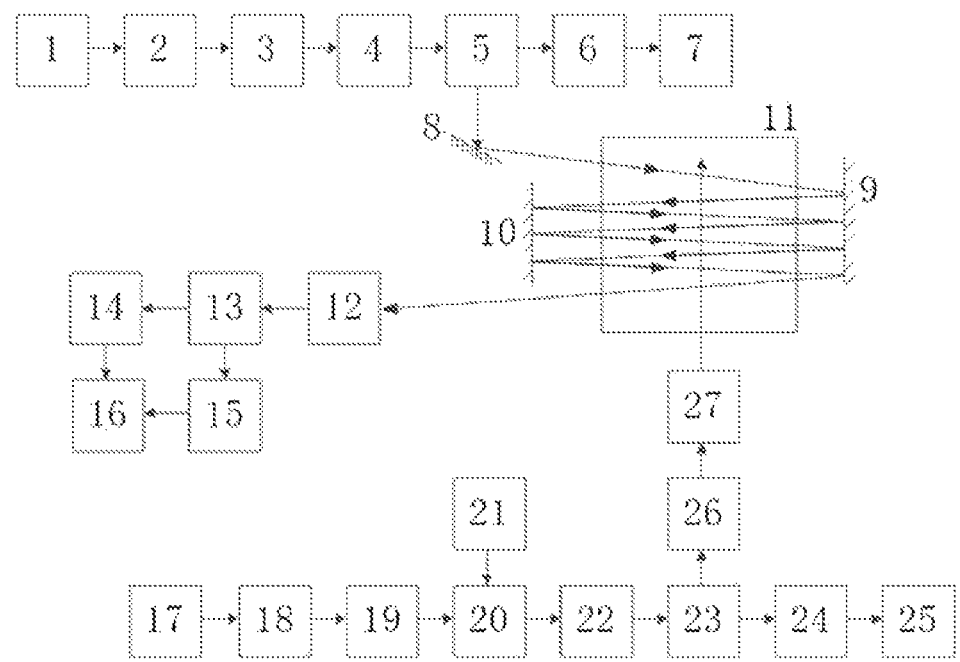
FIG. 1 schematically shows a structure of a high-sensitivity pulsed optical pumping scalar magnetic field measuring device of the disclosure.

The embodiments of this application will be described in detail below with reference to the accompanying drawings and not intended to limit the scope of the disclosure. It should be understood that replacements, modifications and variations made by those skilled in the art without departing from the spirit and scope of the disclosure shall fall within the scope of the disclosure defined by the appended claims.

As used herein, terms "up", "down", "front", "back", "left", "right", "vertical", "horizontal", "top", "bottom", "inner" and "outer" refer to orientational or positional relationship shown in the drawings, which are merely for better description of the present disclosure instead of indicating or implying that the device or element referred to must have a specific orientation, be constructed and operated in a specific orientation. Therefore, these terms should not be construed as a limitation to the present disclosure. In addition, terms "first" and "second" should be understood to include incorporation of one or more such elements. Unless otherwise specified, "plurality of" means two or more than two.

Unless otherwise specified, terms as "install", "connect", "joint" and "fix" should be understood in a broad sense, such as fixed connection, detachable connection or integrated connection; mechanical connection, or electrical connection; a direct connection, indirect connection or connection within two components.

Unless otherwise specified, terms "up", "above" and "upside" is a feature directly above or diagonally above another feature, or a height of a feature is higher than that of another feature. Terms "below", "down" and "downside" is a feature directly below or diagonally below another feature, or a height of a feature is lower than that of another feature.

Embodiment 1

Figure 2:
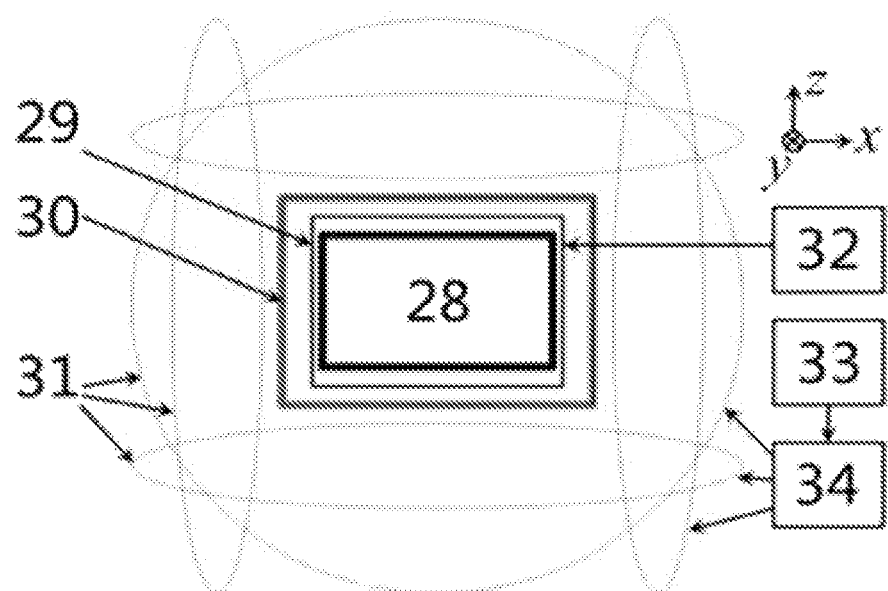
FIG. 2 schematically shows a structure of an atomic sensor probe of the disclosure.

Referring to FIGS. 1-2, a device for measuring a scalar magnetic field based on pulsed optical pumping includes a first laser 2 configured to emit a probe beam and a second laser 18 configured to emit a pump beam.

An output end of the second laser 18 is connected to an input end of a second isolator 19. An output end of the second isolator 19 is connected to an input end of an acousto-optic modulator 20 configured to control beam intensity. An output end of the acousto-optic modulator 20 is connected to an input end of a second $\lambda/2$ waveplate 22. An output end of the second $\lambda/2$ waveplate 22 is connected to an input end of a second polarizing beam splitter 23 configured to split a beam into two beams. A first output end of the second polarizing beam splitter 23 is connected to an input end of a second fiber coupler 24. An output end of the second fiber coupler 24 is connected to an input end of a second spectrum analyzer 25 configured to perform dynamic inspection. A second output end of the second polarizing beam splitter 23 is connected to a $\lambda/4$ waveplate 26 configured to transform a beam into a circularly polarized beam. An output beam of the $\lambda/4$ waveplate 26 is configured to be expanded by a beam expander 27 and then enter an atomic sensor probe 11. The second laser 18 is electrically connected to a second controller 17. The second controller 17 is configured to control a temperature and current of the second laser 18. The acousto-optic modulator 20 is electrically connected to a third controller 21 configured to control the acousto-optic modulator 20. The second laser 18 emits a laser as a pump beam. The pump beam passes through the second isolator 19, where an intensity of the pump beam is controlled by the acousto-optic modulator 20 and the third controller 21. The pump beam then passes through the second $\lambda/2$ waveplate 22 and the second polarizing beam splitter 23 to be split into two beams. One of the two beams passes through the second fiber coupler 24 and enters into the second spectrum analyzer 25 for dynamic detection. The other of the two beams passes through the $\lambda/4$ waveplate 26 to be transformed into a circularly polarized beam, is expanded by the beam expander 27 and then enters the atomic sensor probe 11.

An output end of the first laser 2 is connected to an input end of a first isolator 3. An output end of the first isolator 3 is connected to an input end of a first $\lambda/2$ waveplate 4. An output end of the first $\lambda/2$ waveplate 4 is connected to an input end of a first polarizing beam splitter 5 configured to split a beam into two beams. A first output end of the first polarizing beam splitter 5 is connected to an input end of a first coupler 6. An output end of the first coupler 6 is connected to an input end of a first spectrum analyzer 7 configured to perform dynamic detection. A beam output from a second output end of the first polarizing beam splitter 5 is configured to be transformed by a reflector 8 and then enter an atomic sensor probe 11. An emergent light from the atomic sensor probe 11 is configured to be input to a third $\lambda/2$ waveplate 12. An output end of the third $\lambda/2$ waveplate 12 is connected to an input end of a third polarizing beam splitter 13 configured to split a beam into two beams. A first output end of the third polarizing beam splitter 13 is connected to an input end of a first photoelectric converter 14. A second output end of the third polarizing beam splitter 13 is connected to an input end of a second photoelectric converter 15. A differential output end of the first photoelectric converter 14 and a differential output end of the second photoelectric converter 15 are both connected to a data acquisition system 16 configured to acquire, store, process and display a detection signal. The first laser 2 is electrically connected to a first controller 1. The first controller 1 is configured to control a temperature and current of the first laser 2. A first planar reflector 10 is arranged at one side of the atomic sensor probe 11, and a second planar reflector 9 is arranged at the other side of the atomic sensor probe 11. The first planar reflector 10 and the second planar reflector 9 both face toward the atomic sensor probe 11. The first planar reflector 10 and the second planar reflector 9 are arranged parallel to the pump beam input to the atomic sensor probe 11. The first laser 2 emits a laser as a probe beam. The probe beam passes through the first isolator 3 and the first λ/2 waveplate 4, followed by the first polarizing beam splitter 5 so as to be split into two beams. One of the two beams enters the first coupler 6 and is transmitted to the first spectrum analyzer 7 for dynamic detection. The other of the two beams passes through the reflector 8 so as to be transformed and then enters into the atomic sensor probe 11. In the device provided herein, the beam entering the reflector 8 can be reflected multiple times between the second planar reflector 9, the first planar reflector 10 and the atomic sensor probe 11, increasing an optical effective action distance and an angle of Faraday rotation. Then the beam entering the reflector 8 passes through the third λ/2 waveplate 12 and is split into two beams by the third polarizing beam splitter 13. Differential detection is performed by the first photoelectric converter 14 and the second photoelectric converter 15, and a detection signal is acquired, stored, processed and displayed by the data acquisition system 16.

The atomic sensor probe 11 includes a vapor cell 28. A thermal insulation chamber 30 is provided outside of the vapor cell 28. A heater 29 configured to heat the vapor cell is provided inside of the thermal insulation chamber 30. The heater 29 is connected to a temperature controller 32 configured for temperature stabilization. A three-dimensional (3D) magnetic field coil 31 is provided outside of the vapor cell 28. A precision current source 34 of the 3D magnetic field coil 31 is electrically connected to a fourth controller 33 configured to control magnetic field magnitude. The vapor cell 28 is transparent and filled with saturated rubidium vapor. The vapor cell 28 is used as a medium for interaction of atoms with magnetic field and is heated by the heater 29, in which a temperature is controlled by the temperature controller 32. The thermal insulation chamber 30 is configured to reduce a heat loss. In combination with the precision current source 34, the 3D magnetic field coil 31 can be used to generate magnetic fields respectively variable in x, y and z directions. The magnetic field is controlled by the fourth controller 33.

By means of the combination of parallel planar reflectors and the atomic sensor probe, the disclosure enables the multiple optical path return-back of the pump beam and the probe beam, effectively increases the action distance and angle of Faraday rotation light, and allows a more stable structure, improving the magnetic field measurement sensitivity. Moreover, the device provided herein has easy assembly and simple adjustment.

Embodiment 2

Provided herein is a method for measuring a scalar magnetic field using a pulsed pumping-based NMOR scalar detection method. According to the atomic spin after the polarization of the pump beam, the precession (Larmor precession) will be produced in the magnetic field. By measuring the precession frequency of the atomic spin by the probe light, the magnetic field information such as intensity can be precisely obtained.

The device in Embodiment 1 is assembled. The second planar reflector 9, the first planar reflector 10 and the atomic sensor probe 11 are adjusted to perform multiple round-trip reflections. An operating sequence of individual components, such as the first controller 1, the second controller 17, the third controller 21, the fourth controller 33, the data acquisition system 16 and the temperature controller 32, is controlled by means of a control signal synchronized with the clock signal, so as to measure an optical signal change caused by spin change of atoms in the vapor cell 28. The optical signal change is recorded and analyzed by the data acquisition system 16 to invert an information of a magnetic field to be measured. A corresponding sequential control includes a continuous mode and a gap mode. The continuous mode is universally applicable. The gap mode is suitable for situations where other interrupt-type operations need to be performed gaply, or where a large amount of data needs to be processed in a short period of time. In actual measurement, the sequential control is flexible.

Under the continuous mode, the method is performed through the following steps.

(a) Positions of the first planar reflector 10 and the second planar reflector 9 are adjusted. The atomic sensor probe 11 is placed into a magnetic shield. The atomic sensor probe 11 is heated to a preset temperature to generate a static magnetic field along a z-direction of a 3D magnetic field coil. An alternating magnetic field is superimposed on the static magnetic field.

Figure 3:
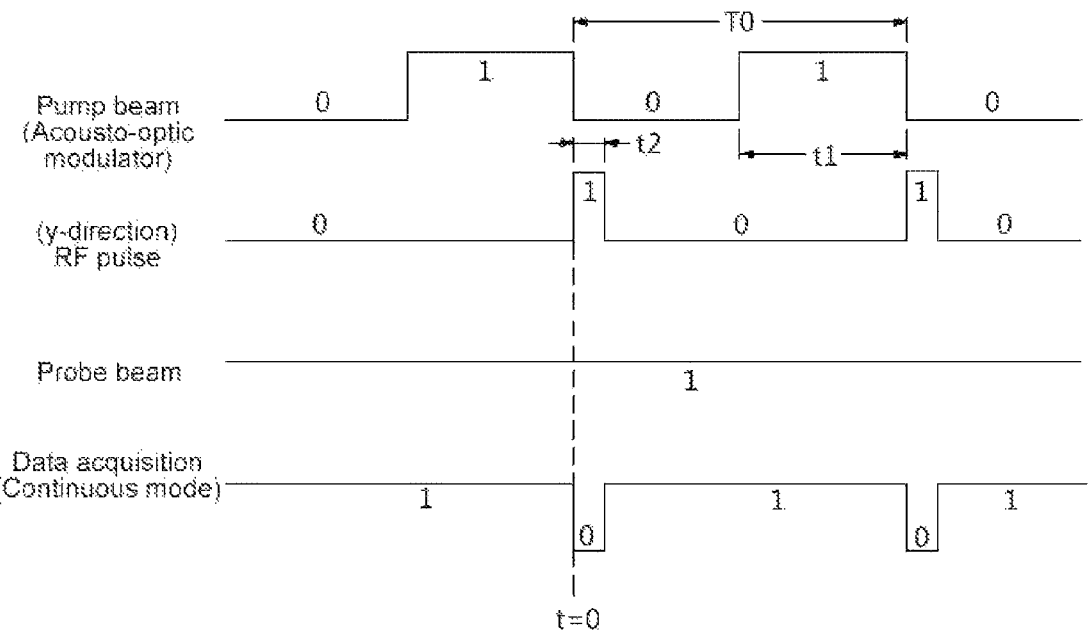
FIG. 3 schematically shows a sequential control of pulse under a continuous mode of the disclosure.

(b) From an initial moment t=0, the second laser 18 is periodically turned off and on by the acousto-optic modulator 20 in combination with the third controller 21 under a sequential control of pulse shown in FIG. 3 to periodically emit the pump beam. A turn-on duration of the pump beam is $t_1$, and a duration of each on-off cycle is $T_0$.

(c) From the initial moment t=0, a RF pulse is loaded by the fourth controller 33 in a y-direction of the 3D magnetic field coil 31. A duration of the RF pulse is $t_2$. The RF pulse is in a sinusoidal waveform. A frequency of the RF pulse is same as an atomic spin precession frequency. An amplitude and the duration of the RF pulse are optimizable according to an optical measurement signal.

(d) From the initial moment t=0, the first laser is continuously turned on to emit the probe beam to pass through the atomic sensor probe to generate a signal. A signal is received by the first photoelectric converter 14 and the second photoelectric converter 15.

(e) From the initial moment t=0, the signal received by the first photoelectric converter and the second photoelectric converter is acquired and analyzed by the data acquisition system 16. An effective data duration of the signal is $T_0 - t_2$ and a sequential control is shown in FIG. 3.

(f) Under the continuous mode and the sequential control as shown in FIG. 3, from the initial moment t=0, ambient magnetic field data is periodically and continuously acquired. A sampling frequency $f_s$ of an original data point (generally refers to a frequency of analog-to-digital conversion, sampling an atomic spin oscillation signal) is determined by the data acquisition system 16. In each pulse period of which a duration is the same as the duration of each on-off cycle $T_0$, the signal is analyzed to obtain an ambient magnetic field data point $B_n$ containing a time stamp, such that a sampling frequency of the ambient magnetic field data $B_1, B_2, B_3 \ldots B_n$ is $1/T_0$. Each time stamp and each pulse are precisely synchronized.

(g) The ambient magnetic field data is subjected to spectral analysis and then is fitted to obtain a measurement sensitivity and a magnetic field change frequency.

Under the gap mode, the method is performed through the following steps.

(a) Positions of the first planar reflector 10 and the second planar reflector 9 are adjusted. The atomic sensor probe 11 is placed into a magnetic shield. The atomic sensor probe 11 is heated to a preset temperature to generate a static magnetic field along a z-direction of a 3D magnetic field coil. An alternating magnetic field is superimposed on the static magnetic field.

(b) From an initial moment t=0, the second laser 18 is periodically turned off and on by the acousto-optic modulator 20 in combination with the third controller 21 under a sequential control of pulse shown in FIG. 3 to periodically emit the pump beam. A turn-on duration of the pump beam is $t_1$, and a duration of each on-off cycle is $T_0$.

(c) From the initial moment t=0, a RF pulse is loaded by the fourth controller 33 in a y-direction of the 3D magnetic field coil 31. A duration of the RF pulse is $t_2$. The RF pulse is in a sinusoidal waveform. A frequency of the RF pulse is same as an atomic spin precession frequency. An amplitude and the duration of the RF pulse are optimizable according to an optical measurement signal.

(d) From the initial moment t=0, the first laser is continuously turned on to emit the probe beam to pass through the atomic sensor probe to generate a signal. A signal is received by the first photoelectric converter 14 and the second photoelectric converter 15.

(e) From the initial moment t=0, the signal received by the first photoelectric converter and the second photoelectric converter is acquired and analyzed by the data acquisition system 16. An effective data duration of the signal is $T_0-t_2$ and a sequential control is shown in FIG. 3.

Figure 4:
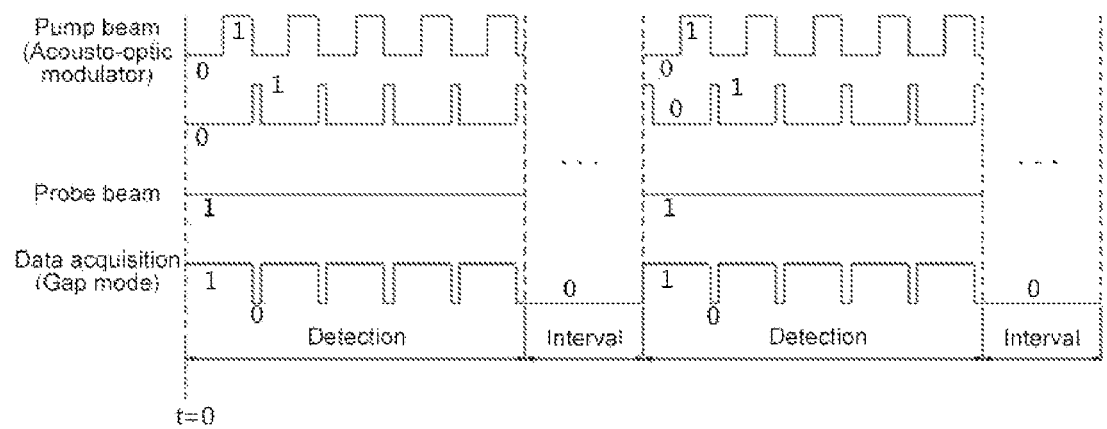
FIG. 4 schematically shows a sequential control of pulse under a gap mode of the disclosure.

(f) Under the gap mode and a sequential control as shown in FIG. 4, from the initial moment t=0. Periodic and continuous sampling are performed N times followed by an interval without sampling. Then periodic and continuous sampling are performed N times again followed by an interval without sampling. Such processes are repeated. A sampling frequency $f_s$ of an original data point is determined by the data acquisition system. In each pulse period of which a duration is the same as the duration of each on-off cycle $T_0$, the signal is analyzed to obtain an ambient magnetic field data point $B_n$ containing a time stamp. Every N ambient magnetic field data points are grouped into one group, and a sampling frequency of each group is $1/T_0$. An interval is provided between adjacent two groups. Data measurement is not performed during the interval.

(g) The ambient magnetic field data is subjected to spectral analysis and then is fitted to obtain a measurement sensitivity and a magnetic field change frequency.

This application optimizes a measurement mean and data processing method. The continuous mode or gap mode is performed. Other interrupt operations can be performed during the measurement process, and a sampling can still be efficiently performed when a data volume is large, increasing the sampling frequency of magnetic field measurement $f_B$. In the magnetic field measurement provided herein, a high sensitivity of weak magnetic field measurement is achieved, and the sampling frequency is improved.

An embodiment is specifically performed as follows.

(1) The first controller 1 controls the first laser 2 to emit a probe beam with a wavelength of 795.01 nm and a power of 7 mW. The probe beam passes through the first λ/2 waveplate 4 and the first polarizing beam splitter 5, and enters the atomic sensor probe 11 with a power of 0.2 mW.

(2) The probe beam is input to the second planar reflector 9 with an incidence angle of 4°. The first planar reflector 10 and the second planar reflector 9 are arranged parallel and spaced 20 cm to enable the probe beam to be reflected back and forth for 4 times and then output from the atomic sensor probe 11.

(3) The vapor cell 28 of the atomic sensor probe 11 filled with saturated rubidium 87 vapor. The heater 29 heats the vapor cell 28 to 90° C. controlled by the temperature controller 32.

(4) The atomic sensor probe 11 is placed into a magnetic shield to shield an electromagnetic field interference.

(5) In the atomic sensor probe 11, the fourth controller 33 is configured to control the precision current source 34 to enable the 3D magnetic field coil 31 to generate a static magnetic field with intensity of 13.7 µT in the z-direction followed by superimposing an alternating magnetic field with intensity of 11.6 nT and frequency of 500 Hz.

(6) The probe beam output from the atomic sensor probe 11 passes through the third λ/2 waveplate 12 and the third polarizing beam splitter 13, then is transformed to an electrical signal by the first photoelectric converter 14 and the second photoelectric converter 15, and acquired by the data acquisition system 16. The sampling frequency $f_s$ of an original data point is 10 MHz.

(7) The second laser 18 is set by the second controller 17 to emit a pump beam with a wavelength of 794.98 nm and power of 40 mW.

(8) The acousto-optic modulator 20 is controlled by the third controller 21. A turn-on duration $t_1$ is 0.25 ms and a duration of a pulse period which is the same as the duration of each on-off cycle $T_0$ is 0.5 ms.

(9) When the acousto-optic modulator 20 is turned on, the pump beam passes through the second λ/2 waveplate 22 and the second polarizing beam splitter 23, followed by the λ/4 waveplate 26 and the beam expander 27, such that the pump beam enters the atomic sensor probe 11 with the power of 39 mW.

(10) The precision current source 34 is controlled by the precision current source 34 to enable the 3D magnetic field coil 31 to generate a RF pulse in the y-direction with a duration $t_2$ is 0.03 ms.

(11) The probe beam is continuously turning on.

(12) Under the continuous mode, after removing the RF pulse duration $t_2$=0.03 ms, the data acquisition system 16 periodically and continuously acquires the signal with a sampling frequency $f_B$ of magnetic field measurement of 2 kHz.

(13) Under the gap mode, periodic and continuous sampling are performed 10 times with a sampling frequency of magnetic field measurement $f_B$ of 2 kHz, followed by an interval of 7 ms without sampling. then periodic and continuous sampling are performed 10 times again. Such processes are repeated.

Figure 5:
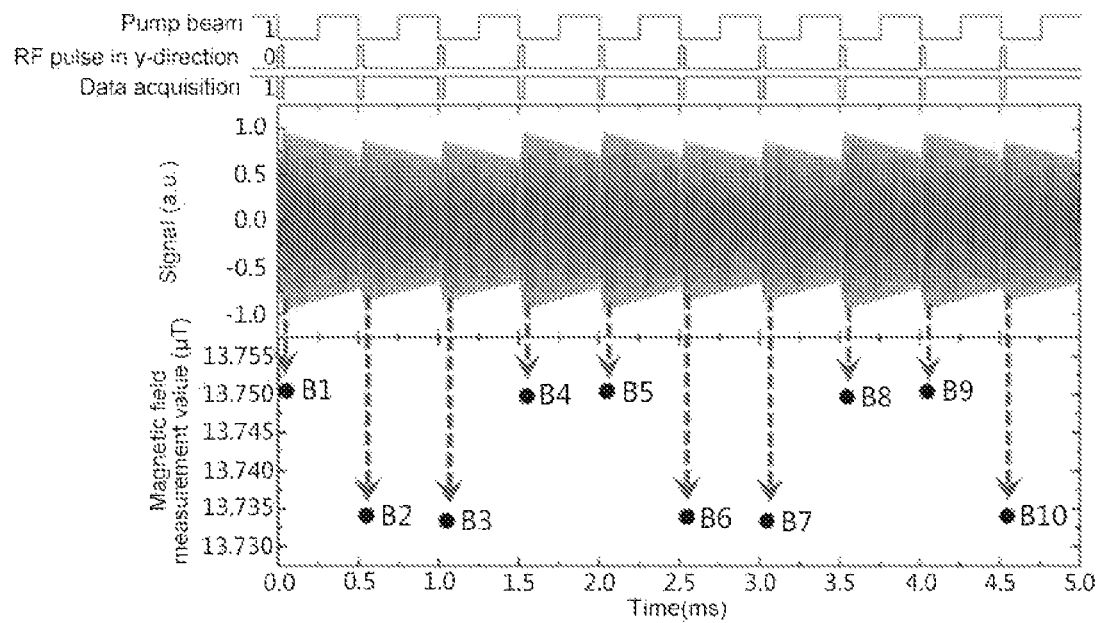
FIG. 5 shows the sequential control of pulse under the continuous mode and magnetic field measurement results of the disclosure.

(14) A sequential control under the continuous mode and original signal of 10 ambient magnetic field data $B_1$-$B_{10}$ and analysis results are shown in FIG. 5.

Figure 6:
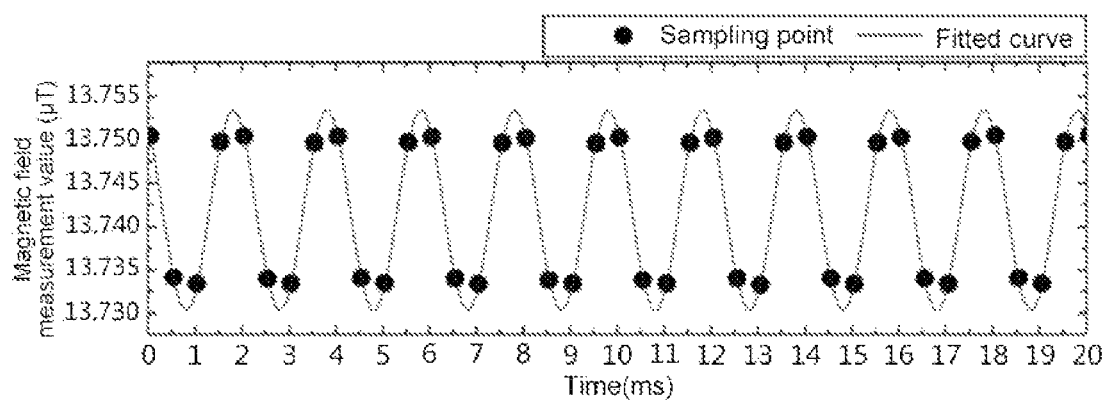
FIG. 6 shows magnetic field measurement results acquired under the continuous mode and recovery of signal of the disclosure.

(15) FIG. 6 shows magnetic field measurement results according to FIG. 5. Original signal s of the alternating magnetic field with intensity of 11.6 nT and frequency of 500 Hz are recovered by fitting the ambient magnetic field data measured in the continuous mode.

Figure 7:
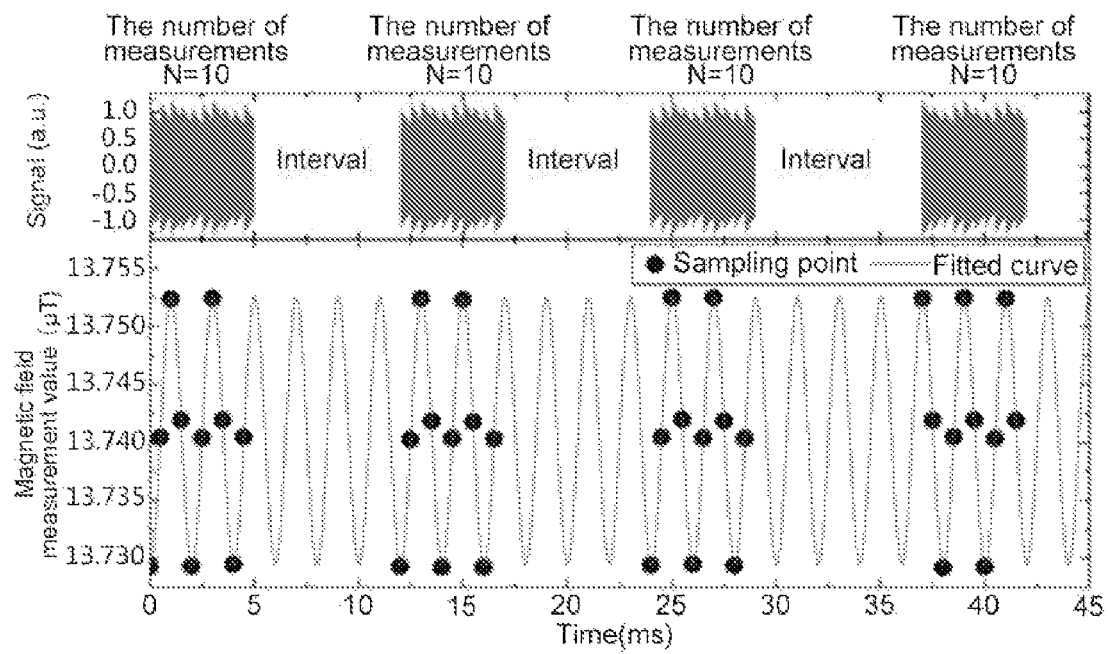
FIG. 7 schematically shows the gap mode of the disclosure.

(16) Referring to FIG. 7, under the gap mode 10 ambient magnetic field data points are grouped into one group. For example, $B_1$, $B_2$, $B_3$ ... $B_{10}$ are grouped into a group and $B_{11}$, $B_{N+2}$, $B_{N+3}$ ... $B_{20}$ are grouped into a group. And corresponding magnetic field measurement results are shown. Original signal s of the alternating magnetic field with intensity of 11.6 nT and frequency of 500 Hz are also recovered.

Figure 8:
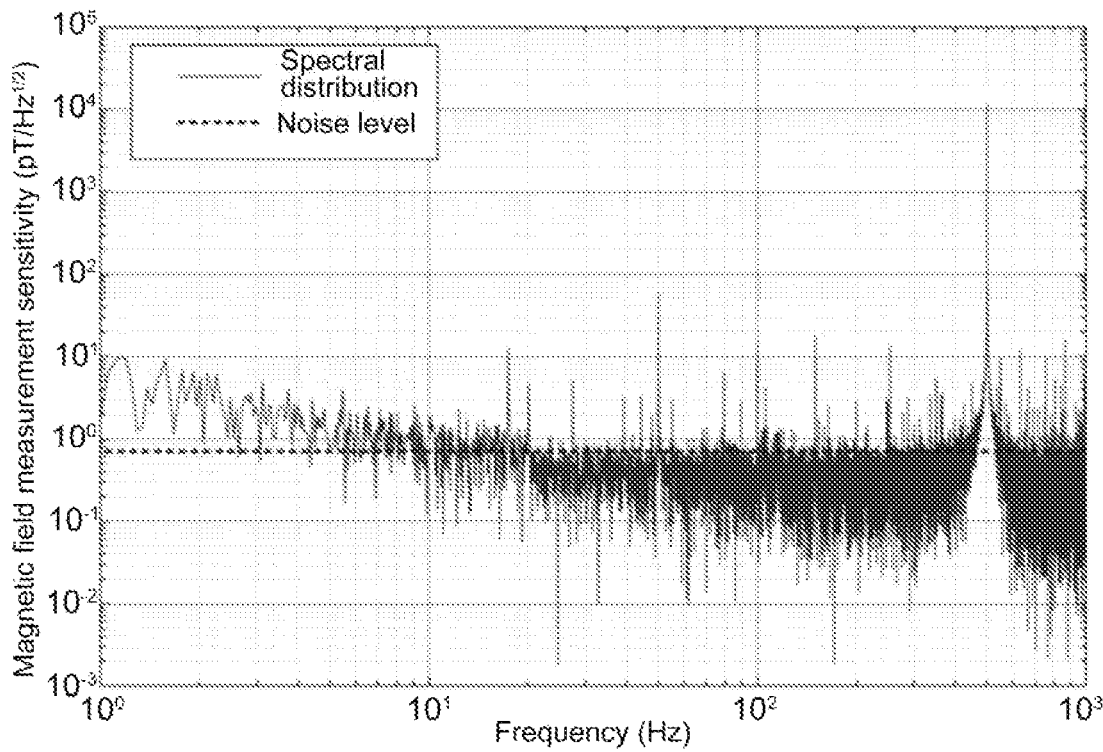
FIG. 8 schematically shows a spectrum curve of sensitivity of the magnetic field measurement.

(17) FIG. 8 shows a FFT-transformed spectral distribution of 20 s ambient magnetic field data and a noise level.

Accordingly, the magnetic field measurement sensitivity is larger than 700 fT/Hz$^{1/2}$ within 10-1000 Hz.

In summary, in this embodiment, the magnetic field measurement frequency reaches 2 kHz, and the measurement sensitivity is higher than 700 fT/Hz$^{1/2}$ within 10-1000 Hz.

What is claimed is:

1. A device for measuring a scalar magnetic field based on pulsed optical pumping, comprising:

a first laser configured to emit a probe beam; and a second laser configured to emit a pump beam;

wherein an output end of the first laser is connected to an input end of a first isolator; an output end of the first isolator is connected to an input end of a first λ/2 waveplate; an output end of the first λ/2 waveplate is connected to an input end of a first polarizing beam splitter configured to split a beam into two beams; a first output end of the first polarizing beam splitter is connected to an input end of a first fiber coupler; an output end of the first fiber coupler is connected to an input end of a first spectrum analyzer configured to perform dynamic detection; a beam output from a second output end of the first polarizing beam splitter is configured to be transformed by a reflector and then enter an atomic sensor probe; an emergent light from the atomic sensor probe is configured to be input to a second λ/2 waveplate; an output end of the second λ/2 waveplate is connected to an input end of a second polarizing beam splitter configured to split a beam into two beams; a first output end of the second polarizing beam splitter is connected to an input end of a first photoelectric converter; a second output end of the second polarizing beam splitter is connected to an input end of a second photoelectric converter; and a differential output end of the first photoelectric converter and a differential output end of the second photoelectric converter are both connected to a data acquisition system configured to acquire, store, process and display a detection signal;

an output end of the second laser is connected to an input end of a second isolator; an output end of the second isolator is connected to an input end of an acousto-optic modulator configured to control beam intensity; an output end of the acousto-optic modulator is connected to an input end of a third λ/2 waveplate; an output end of the third λ/2 waveplate is connected to an input end of a third polarizing beam splitter configured to split a beam into two beams; a first output end of the third polarizing beam splitter is connected to an input end of a second fiber coupler; an output end of the second fiber coupler is connected to an input end of a second spectrum analyzer configured to perform dynamic detection; a second output end of the third polarizing beam splitter is connected to a λ/4 waveplate configured to transform a beam into a circularly polarized beam; and an output beam of the λ/4 waveplate is configured to be expanded by a beam expander and then enter the atomic sensor probe; and a first planar reflector is arranged at one side of the atomic sensor probe, and a second planar reflector is arranged at the other side of the atomic sensor probe; the first planar reflector and the second planar reflector both face toward the atomic sensor probe; and the first plane reflector and the second planar reflector are arranged parallel to a pump beam input to the atomic sensor probe.

2. The device of claim 1, wherein the atomic sensor probe comprises a vapor cell; a thermal insulation chamber is provided outside the vapor cell; a heater configured to heat the vapor cell is provided inside the thermal insulation chamber; the heater is connected to a temperature controller configured for temperature stabilization; a three-dimensional (3D) magnetic field coil is provided outside the vapor cell; and a precision current source of the 3D magnetic field coil is electrically connected to a controller configured to control magnetic field intensity.

3. The device of claim 2, wherein the vapor cell is transparent and filled with saturated rubidium vapor.

4. The device of claim 1, wherein the first laser is electrically connected to a controller; and the controller is configured to control a temperature and current of the first laser.

5. The device of claim 1, wherein the second laser is electrically connected to a controller; and the controller is configured to control a temperature and current of the second laser.

6. The device of claim 1, wherein the acousto-optic modulator is electrically connected to a controller configured to control the acousto-optic modulator.

7. A method for measuring a scalar magnetic field using the device of claim 1, comprising:

(a) adjusting positions of the first planar reflector and the second planar reflector; placing the atomic sensor probe into a magnetic shield; heating the atomic sensor probe to a preset temperature to generate a static magnetic field along a z-direction of a 3D magnetic field coil; and superimposing an alternating magnetic field on the static magnetic field;

(b) from an initial moment t=0, periodically turning off and on, by the acousto-optic modulator in combination with a controller, the second laser to periodically emit the pump beam, wherein a turn-on duration of the second laser is $t_1$, and a duration of each on-off cycle is $T_0$;

(c) from the initial moment t=0, loading a radio frequency (RF) pulse in a y-direction of the 3D magnetic field coil, wherein a duration of the RF pulse is $t_2$; the RF pulse is in a sinusoidal waveform; a frequency of the RF pulse is the same as an atomic spin precession frequency; and an amplitude and the duration of the RF pulse are optimizable according to an optical measurement signal;

(d) from the initial moment t=0, continuously turning on the first laser to emit the probe beam to pass through the atomic sensor probe to generate a signal; and receiving, by the first photoelectric converter and the second photoelectric converter, the signal;

(e) from the initial moment t=0, acquiring and analyzing, by the data acquisition system, the signal received by the first photoelectric converter and the second photoelectric converter, wherein an effective data acquiring duration of the signal is $T_0-t_2$;

(f) under a continuous mode or a gap mode, from the initial moment t=0, acquiring an ambient magnetic field data; and (g) subjecting the ambient magnetic field data to spectral analysis and fitting to obtain a measurement sensitivity and a magnetic field change frequency.

8. The method of claim 7, wherein under the continuous mode, the ambient magnetic field data is periodically and continuously collected; a sampling frequency $f_s$ of an original data point is determined by the data acquisition system; in each pulse period which is the same as each on-off cycle $T_0$, the signal is analyzed to obtain an ambient magnetic field data point $B_n$ containing a time stamp, such that a sampling frequency of ambient magnetic field data points $B_1$, $B_2$, $B_3$ ... $B_n$ is $1/T_0$.

9. The method of claim 7, wherein under the gap mode, the ambient magnetic field data is collected through steps of: performing periodic and continuous sampling N times followed by an interval without sampling; then performing periodic and continuous sampling N times again followed by an interval without sampling; and repeating such processes; a sampling frequency $f_s$ of an original data point is determined by the data acquisition system; in each pulse period which is the same as each on-off cycle $T_0$, the signal is analyzed to obtain an ambient magnetic field data point $B_n$ containing a time stamp; every N ambient magnetic field data points are grouped into one group, and a sampling frequency of each group is $1/T_0$; an interval is provided between adjacent two groups; and data measurement is not performed during the interval.

\* \* \* \* \*